(12) United States Patent
Hayashi

(10) Patent No.: US 6,906,259 B2
(45) Date of Patent: Jun. 14, 2005

(54) HIGH FREQUENCY MODULE

(76) Inventor: Katsuhiko Hayashi, c/o TDK Corporation, 1-13-1, Nihonbashi, Chuo-ku, Tokyo 103-8272 (JP)

(*) Notice: Subject to any disclaimer, the term of this patent is extended or adjusted under 35 U.S.C. 154(b) by 0 days.

(21) Appl. No.: 10/667,583

(22) Filed: Sep. 22, 2003

(65) Prior Publication Data

US 2004/0065462 A1 Apr. 8, 2004

Related U.S. Application Data

(62) Division of application No. 09/787,665, filed as application No. PCT/JP00/04949 on Jul. 25, 2000, now abandoned.

(30) Foreign Application Priority Data

| Jul. 26, 1999 | (JP) | 11-210479 |
| Nov. 16, 1999 | (JP) | 11-326155 |
| Nov. 16, 1999 | (JP) | 11-326156 |

(51) Int. Cl.[7] ............................................. H01L 23/02
(52) U.S. Cl. ..................... 174/52.4; 361/718; 361/719; 257/713; 257/704; 257/707; 257/728
(58) Field of Search ................................. 361/718, 719; 257/713, 704, 707, 728; 174/52.4

(56) References Cited

U.S. PATENT DOCUMENTS

| 4,323,914 A | * 4/1982 | Berndlmaier et al. ....... 257/713 |
| 5,831,836 A | 11/1998 | Long et al. |
| 5,832,598 A | 11/1998 | Greenman et al. |
| 5,973,923 A | * 10/1999 | Jitaru ........................ 361/704 |
| 6,091,603 A | 7/2000 | Daves et al. |
| 6,163,456 A | * 12/2000 | Suzuki et al. ............... 361/704 |
| 6,294,731 B1 | 9/2001 | Lu et al. |

FOREIGN PATENT DOCUMENTS

JP 10-501102 1/1998

* cited by examiner

*Primary Examiner*—Hung V. Ngo
(74) *Attorney, Agent, or Firm*—Brown Raysman Millstein Felder & Steiner LLP

(57) ABSTRACT

An object of the present invention is to provide a high frequency module which can efficiently radiate heat generated from a semiconductor chip. A high frequency module according to the present invention employs a substrate 11, a semiconductor chip 13 fixed on the substrate 11, a roof plate 15 being contact with an upper surface 13a of the semiconductor chip 13, and a cap, which is contact with an upper surface of the roof plate, having a flat portion 16a and extended portions 16b leaded out below from opposite ends of the flat portion 16a. The extended portions 16b of the cap 16 are contact with side surfaces of the substrate 11. Thus, a wide area contact between the extended portions 16b of the cap 16 and the side surfaces of the substrate 11 can be ensured even if the height of the semiconductor chip 13 fluctuates or the shape of the cap 16 fluctuates. This results that heat generated from the semiconductor chip 13 is efficiently radiated to the substrate 11.

13 Claims, 11 Drawing Sheets

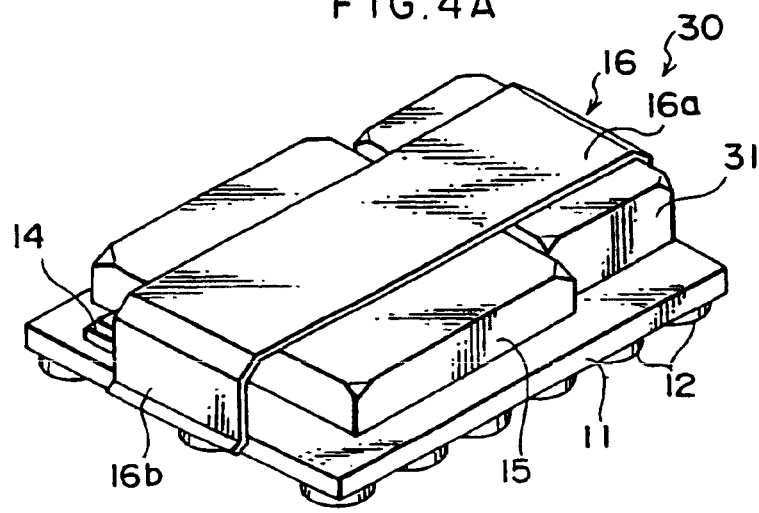
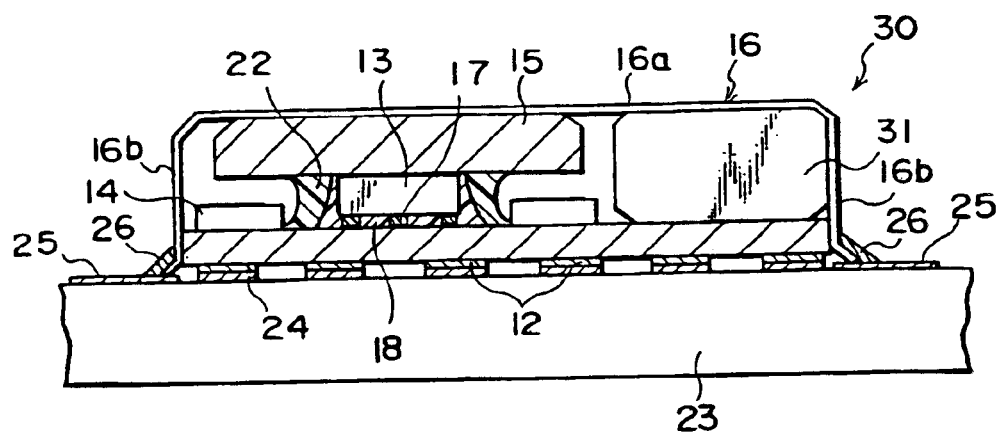

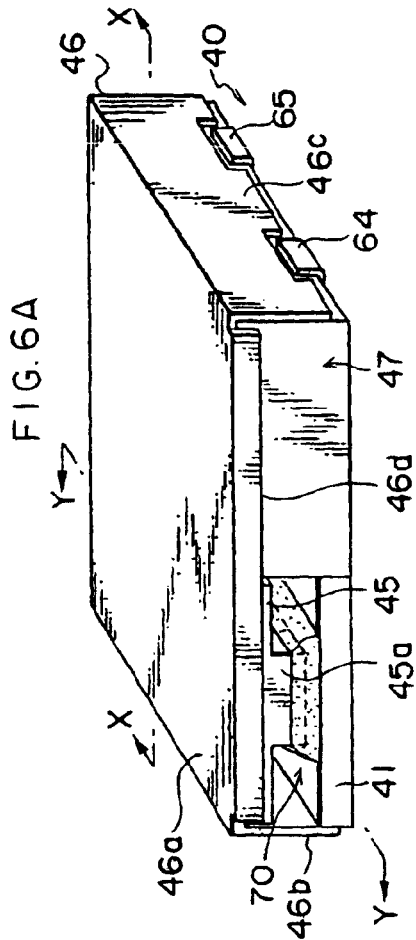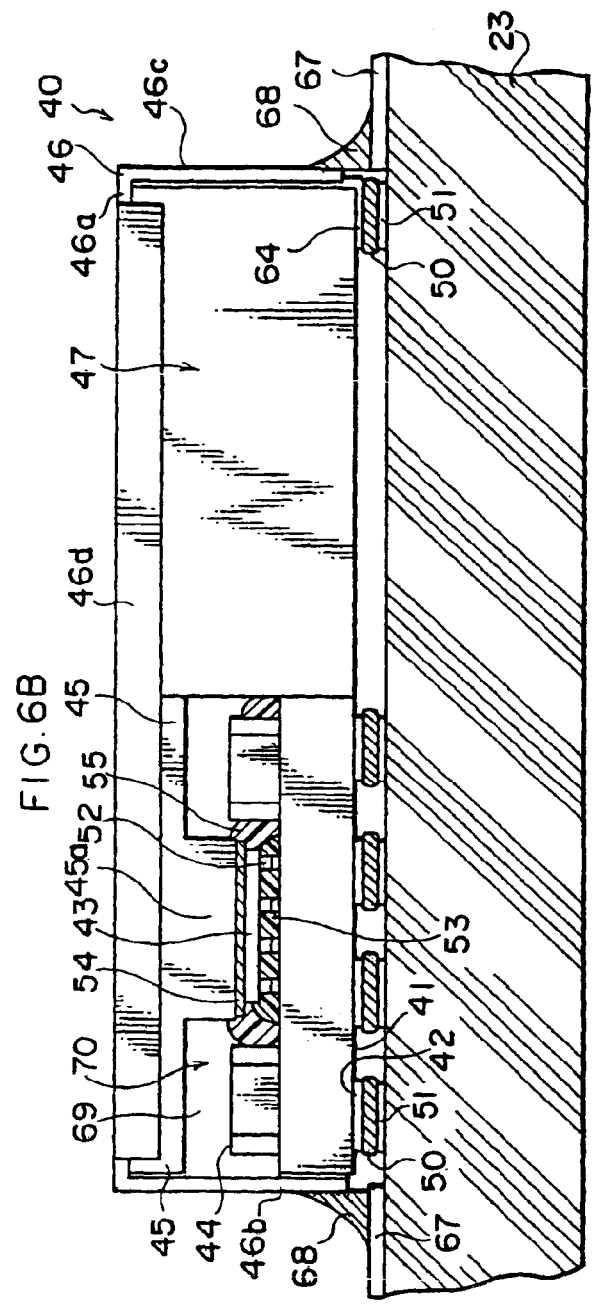

HIGH FREQUENCY MODULE

CROSS-REFERENCE TO RELATED APPLICATIONS

This is a divisional of U.S. patent application Ser. No. 09/787,665, filed Mar. 20, 2001, now abandoned, which claims priority to PCT Application No. PCT/JP00/04949, filed Jul. 25, 2000.

BACKGROUND OF THE INVENTION

The present invention relates to a high frequency module, and particularly, to a high frequency module that employs a semiconductor chip for processing high frequency signals, such as a power amplifier module.

DESCRIPTION OF THE PRIOR ART

A module or package employing a high frequency semiconductor chip is described in, for example, Japanese Patent Application Laid Open No. 10-501102. According to this prior art, a semiconductor chip is mounted on a substrate constituting a package member by the wire bonding method or flip-chip mounting, and a metal cap is provided on the substrate to constitute the high frequency module.

Another high frequency module is described in U.S. Pat. No. 5,831,836. According to this prior art, a semiconductor chip is mounted on a substrate by flip-chip mounting, and a back surface of the semiconductor chip is contacted with a roof portion of a metal cap to constitute the high frequency module.

FIG. 1 is a schematic sectional diagram showing the high frequency module described in U.S. Pat. No. 5,831,836.

As shown in FIG. 1, the high frequency module 1 employs a substrate 2, a semiconductor chip 3, and a metal cap 4. The metal cap 4 is also used as a heat sink. The substrate 2 and the semiconductor chip 3 are electrically connected to each other via microbumps 5 made of solder or gold formed on the outer electrodes provided on the bottom surface of the semiconductor chip 3, i.e., the semiconductor chip 3 is mounted on the substrate 2 by flip-chip mounting. An underfilling 6 is charged and cured a space formed between the substrate 2 and the semiconductor chip 3. The roof portion 4b of the metal cap 4 is adhered to the top surface of the semiconductor chip 3 by a conductive adhesive 7 and the edge portions 4a are fixed to electrodes (not shown) on the substrate 2 by conductive adhesive or solder 8.

The high frequency module shown in FIG. 1 has the following problems.

First, the connection between the semiconductor chip 3 and the substrate 2 is established by the microbumps 5 but the height of the microbumps 5 varies depending on the manufacturing conditions. As a result, the spaces between the semiconductor chip 3 and the substrate 2 varies from product to product. Therefore, the edge portions 4a of the metal cap 4 fixed on the semiconductor chip 3 may not reach the surface of the substrate 2 or, to the contrary, the roof portion 4a of the cap 4 may not reach to the top surface of the semiconductor chip 3.

Second, it is difficult to form the lower edges of the edge portions 4a of the metal cap 4 so as to lie exactly parallel with the roof portion 4b. The lower edges of the edge portions 4a of the metal cap 4 may therefore be formed to have a small angle with the roof portion 4b. When such a metal cap 4 is used, gaps are formed between the lower edges of the edge portions 4a of the metal cap 4 and the substrate 2 because the lower edges of the edge portions 4a of the metal cap 4 slantingly touch the substrate 2.

Each of these problems results in degradation of heat dissipation performance from the semiconductor chip 3 to the substrate 2 via the metal cap 4. In the case where the semiconductor chip 3 processes a signal having large electric power, so that the semiconductor chip 3 generates a lot of heat, heat dissipation from the semiconductor chip 3 to the substrate 2 via the metal cap 4 is particularly important. Such degradation of the heat dissipation performance therefore becomes a serious problem.

It is therefore an object of the present invention to provide an improved high frequency module.

Another object of the present invention is to provide a high frequency module which can efficiently dissipate heat generated by a semiconductor chip.

SUMMARY OF THE INVENTION

The above and other objects of the present invention can be accomplished by a high frequency module for mounting on a motherboard, comprising: a substrate, a semiconductor chip fixed on the substrate, and a cap provided above the semiconductor chip, the cap having a flat portion to which heat generated by the semiconductor chip is transferred and extended portions led out from opposite edges of the flat portion, the extended portions of the cap being in contact with the side surfaces of the substrate.

According to this aspect of the present invention, because the extended portions of the cap are in contact with side surfaces of the substrate, a wide area of contact between the extended portions of the cap and the side surfaces of the substrate can be ensured even if the height of the semiconductor chip deviates slightly from standard or the shape of the cap deviates slightly from standard. Heat transferred to the flat portion of the cap from the semiconductor chip is therefore efficiently conducted to the substrate via the extended portions.

In a preferred aspect of the present invention, the extended portions are connected to electrodes formed on the motherboard.

According to this preferred aspect of the present invention, because the extended portions of the cap are connected to electrodes formed on the motherboard, heat generated by the semiconductor chip is efficiently conducted to the motherboard, which has a large heat capacity. Thus, the heat dissipation performance is further enhanced.

In a further preferred aspect of the present invention, the high frequency module further comprises a roof plate provided between the semiconductor chip and the flat portion of the cap.

According to this preferred aspect of the present invention, the roof plate provided between the semiconductor chip and the flat portion of the cap works as a heat sink to further enhance the heat dissipation performance.

In a further preferred aspect of the present invention, the roof plate is thicker than the flat portion of the cap.

According to this preferred aspect of the present invention, because the roof plate is thicker than the flat portion of the cap, the roof plate has a large heat capacity. The heat dissipation performance is therefore further enhanced.

In a further preferred aspect of the present invention, the roof plate contains aluminum.

According to this preferred aspect of the present invention, the aluminum content of the roof plate makes it advantageous in the electric and thermal conductivity and low in cost. Thus, the heat generated by the semiconductor chip 13 can be thoroughly dissipated and the cost of the high frequency module can be minimized.

In a further preferred aspect of the present invention, the semiconductor chip is mounted on the substrate in a flip-chip manner.

According to this preferred aspect of the present invention, because the semiconductor chip is mounted on the substrate in a flip-chip manner, the size of the high frequency module can be minimized.

In a further preferred aspect of the present invention, the high frequency module further comprises a non reciprocal circuit element mounted on the substrate, the upper surface of the non reciprocal circuit element being in contact with the flat portion of the cap.

According to this preferred aspect of the present invention, because the upper surface of the non reciprocal circuit element is in contact with the flat portion of the cap, the non reciprocal circuit element works as a heat sink. Thus, the heat dissipation performance is further enhanced.

In a further preferred aspect of the present invention, a side surface of the non reciprocal circuit element is in contact with an extended portion of the cap.

According to this preferred aspect of the present invention, because a side surface of the non reciprocal circuit element is in contact with an extended portion of the cap, the non reciprocal circuit element and the cap are in contact over a wide area. The heat dissipation performance is therefore further enhanced.

The above and other objects of the present invention can be also accomplished by a high frequency module for mounting on a motherboard, comprising: a substrate, a semiconductor chip fixed on the substrate, a heat sink having a projecting portion in contact with the semiconductor chip, and means for conducting heat transferred to the heat sink to the substrate.

According to this aspect of the present invention, the total heat capacity of the heat sink is increased by the projecting portion formed to make contact with the semiconductor chip. Thus, heat generated by the semiconductor chip is efficiently conducted to the substrate. Further, because the heat sink is in contact with the semiconductor chip only at the projecting portion, a space is formed between the other portions of the heat sink and the substrate. Thus, this space can be utilized to mount other electronic components-on the substrate.

In a preferred aspect of the present invention, the projecting portion of the heat sink is formed from one end to the other end of the heat sink.

According to this preferred aspect of the present invention, because the projecting portion of the heat sink is formed from one end to the other end of the heat sink, the heat sink can be easily fabricated at low cost. Further, because the projecting portion of the heat sink is formed from one end to the other end of the heat sink, the substrate and the projecting portion of the heat sink are close to each other also at portions other than where the semiconductor chip is mounted. Thus, the substrate and the heat sink can be strongly fixed by providing an adhesive at portions where they are close to each other.

In a further preferred aspect of the present invention, the heat sink is fabricated by extruding aluminum metal.

According to this preferred aspect of the present invention, because the heat sink is fabricated by extruding aluminum metal, the fabrication cost of the heat sink can be decreased.

In a further preferred aspect of the present invention, the heat conducting means is a cap having a flat portion covering the heat sink and extended portions leaded out from opposite edges of the flat portion.

According to this preferred aspect of the present invention, because the means for conducting heat transferred from the heat sink to the substrate is configured by the cap having the flat portion covering the heat sink and the extended portions led out from opposite edges of the flat portion, heat accumulated in the heat sink is conducted from the flat portion of the cap to the substrate via the extended portions of the cap.

In a further preferred aspect of the present invention, an extended portion of the cap is in contact with a first side surface of the substrate.

According to this preferred aspect of the present invention, because an extended portion of the cap is in contact with the first side surface of the substrate, a wide area of contact between the extended portion of the cap and the first side surface of the substrate can be ensured even if the height of the semiconductor chip deviates slightly from standard or the shape of the cap deviates slightly from standard. Heat transferred to the flat portion of the cap from the semiconductor chip is therefore efficiently conducted to the substrate via the extended portion.

In a further preferred aspect of the present invention, the extended portions of the cap are connected to electrodes formed on the motherboard.

According to this preferred aspect of the present invention, because the extended portions of the cap are connected to electrodes formed on the motherboard, heat generated by the semiconductor chip is efficiently conducted to the motherboard which has a large heat capacity. Thus, the heat dissipation performance is further enhanced.

In a further preferred aspect of the present invention, the high frequency module further comprises an electronic component provided in a space formed between the heat sink and the substrate.

According to this preferred aspect of the present invention, a space formed between the heat sink and the substrate at portions other than the projecting portion is effectively utilized.

In a further preferred aspect of the present invention, the electronic component is thicker than the semiconductor chip.

According to this preferred aspect of the present invention, the space formed between the heat sink and the substrate at portions other than the projecting portion, which space is taller than the space formed between the projecting portion of the heat sink and the substrate, is effectively utilized to accommodate an electronic component thicker than the semiconductor chip.

In a further preferred aspect of the present invention, the upper surface of the non reciprocal circuit element is in contact with the flat portion of the cap.

According to this preferred aspect of the present invention, because the upper surface of the non reciprocal circuit element is contact with the flat portion of the cap, the non reciprocal circuit element works as a heat sink. Thus, the heat radiation performance is further enhanced.

In a further preferred aspect of the present invention, a first side surface of the non reciprocal circuit element is in contact with a second side surface of the substrate opposite to the first side surface thereof.

According to this preferred aspect of the present invention, the non reciprocal circuit element is not mounted on the substrate but fixed to the substrate such that first side surface of the non reciprocal circuit element is contact with a second side surface of the substrate. The total height of the high frequency module is therefore not equal to the sum of the thicknesses of the non reciprocal circuit element and the substrate but can be substantially set to only the thickness of the non reciprocal circuit element. The total height can therefore be made small. As a result, the high frequency module can be preferably utilized in a mobile phone or the like.

In a further preferred aspect of the present invention, the second side surface of the substrate and the first side surface of the non reciprocal circuit element have substantially the same length.

According to this preferred aspect of the present invention, because the second side surface of the substrate and the first side surface of the non reciprocal circuit element have substantially the same length, the high frequency module can be formed in the overall shape of a rectangle. This not only makes handling of the high frequency module easy but also makes it unnecessary for the cap to have a complex structure. Cost can therefore be decreased.

In a further preferred aspect of the present invention, the second side surface of the non reciprocal circuit element opposite to the first side surface thereof is in contact with an extended portion of the cap.

According to this preferred aspect of the present invention, because the second side surface of the non reciprocal circuit element opposite to first side surface thereof is in contact with an extended portion of the cap, a wide area of contact between the cap and the non reciprocal circuit element is established. The heat dissipation performance is therefore further enhanced.

In a further preferred aspect of the present invention, the cap has bent portions led out from other opposite edges of the flat portion.

According to this preferred aspect of the present invention, because the cap has bent portions led out from other opposite edges of the flat portion, the mechanical strength of the cap is enhanced.

In a further preferred aspect of the present invention, the bent portion are led out from the flat portion by a shorter distance than the extended portions are led out therefrom.

In a further preferred aspect of the present invention, the bent portions extended to points to short of side surfaces of the substrate to leave openings between the ends thereof and the substrate.

According to this preferred aspect of the present invention, because openings are formed between the ends of the bent portions and the substrate, the inside of the high frequency module can be visually inspected via the openings.

The above and other objects of the present invention can be also accomplished by a high frequency module, comprising:

a high frequency amplifier portion including a substrate having first and second side surfaces, a semiconductor chip mounted on the substrate, and a heat sink provided above the semiconductor chip;

a non reciprocal circuit element having first and second side surfaces; and a cap having a flat portion, a first extended portion, and a second extended portion, the high frequency amplifier portion being fixed to the non reciprocal circuit element such that the first side surface of the substrate is contact with the first side surface of the non reciprocal circuit element, the cap being fixed to the high frequency amplifier portion and the non reciprocal circuit element such that the flat portion of the cap is in contact with at least the heat sink of the high frequency amplifier portion, that the first extended portion of the cap is contact with the second side surface of the substrate, and that that the second extended portion of the cap is contact with the second side surface of the non reciprocal circuit element.

According to this aspect of the present invention, the non reciprocal circuit element is not mounted on the substrate, which is part of the high frequency amplifier portion, but fixed to the substrate such that the first side surface of the non reciprocal circuit element is in contact with the first side surface of the substrate. The total height of the high frequency module is therefore not equal to the sum of the thicknesses of the non reciprocal circuit element and the substrate but can be substantially set to only the thickness of the non reciprocal circuit element. The total height can therefore be made small. As a result, the high frequency module can be preferably utilized in a mobile phone or the like. Moreover, because the high frequency amplifier portion and the non reciprocal circuit element are both covered with the cap, the high frequency module is made easy to handle.

In a preferred aspect of the present invention, the first side surface of the substrate and the first side surface of the non reciprocal circuit element have substantially the same length.

According to this preferred aspect of the present invention, because the first side surface of the substrate and the first side surface of the non reciprocal circuit element have substantially the same length, the high frequency module can be formed in the overall shape of a rectangle. This not only makes handling of the high frequency module easy but also makes it unnecessary for the cap to have a complex structure. Cost can therefore be decreased.

In a further preferred aspect of the present invention, the first side surface of the non reciprocal circuit element is longer than the distance between the first side surface and the second side surface of the non reciprocal circuit element.

According to this preferred aspect of the present invention, the length of first side surface of the non reciprocal circuit element is made greater than the distance between the first side surface and the second side surface thereof and is preferably made the same as the length of first side surface of the substrate. A permanent magnet of large size in plan view can therefore be included in the non reciprocal circuit element. As a result, a strong magnetic force can be obtained without changing the thickness of the non reciprocal circuit element. Since this means that the thickness of the permanent magnet can be minimized while still obtaining the required magnetic force, the total height of the high frequency module can be reduced.

In a further preferred aspect of the present invention, the first extended portion of the cap is electrically connected to a motherboard on which the high frequency module is mounted.

According to this preferred aspect of the present invention, because the first extended portion of the cap is electrically connected to the motherboard on which the high frequency module is mounted, heat generated by the semiconductor chip is efficiently conducted to the motherboard, which has a large heat capacity. Further, a predetermined potential can be applied to the semiconductor chip via the cap.

In a further preferred aspect of the present invention, the non reciprocal circuit element further has an upper surface, the flat portion of the cap being in contact with the upper surface of the non reciprocal circuit element.

According to this preferred aspect of the present invention, because the flat portion of the cap is in contact with the upper surface of the non reciprocal circuit element, the non reciprocal circuit element works as a heat sink. Thus, the heat dissipation performance is enhanced.

BRIEF DESCRIPTION OF THE DRAWINGS

FIG. 4A is a perspective view showing a high frequency module that is another preferred embodiment of the present invention. FIG. 4B is a sectional view showing the high frequency module mounted on a motherboard.

FIG. 6A is a perspective view showing a high frequency module that is a further preferred embodiment of the present invention. FIG. 6B is a sectional view showing the high frequency module mounted on a motherboard.

DESCRIPTION OF THE PREFERRED EMBODIMENT

Preferred embodiments of the present invention will be explained with reference to the drawings.

Figure 1:
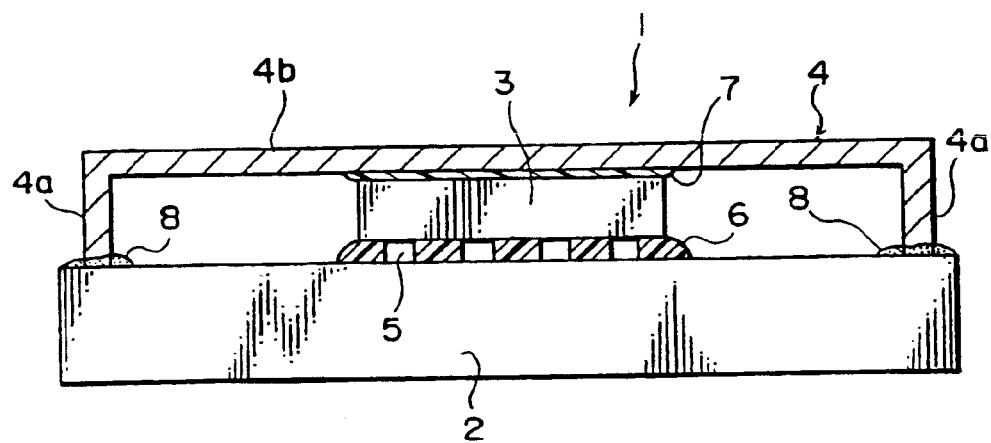
FIG. 1 is a schematic sectional diagram showing a prior-art high frequency module described in U.S. Pat. No. 5,831,836.
Figure 2A:
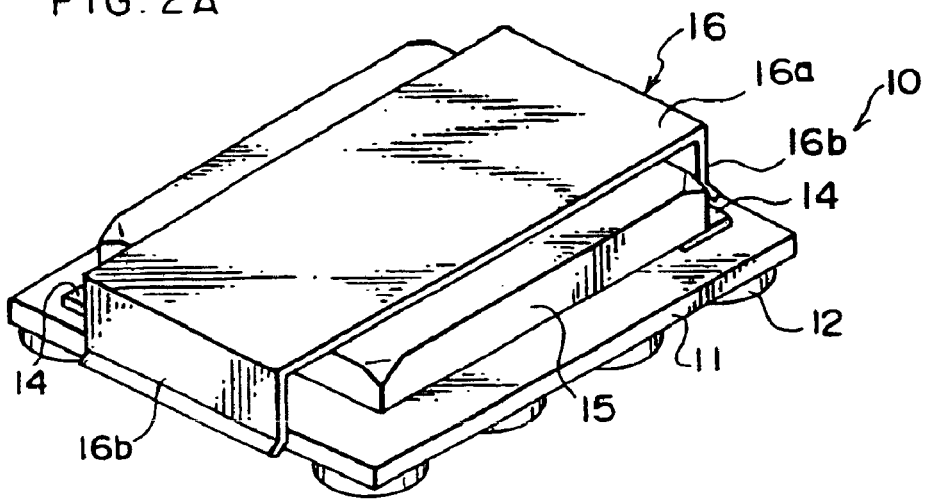
FIG. 2A is a perspective view showing a high frequency module that is a preferred embodiment of the present invention.
Figure 2B:
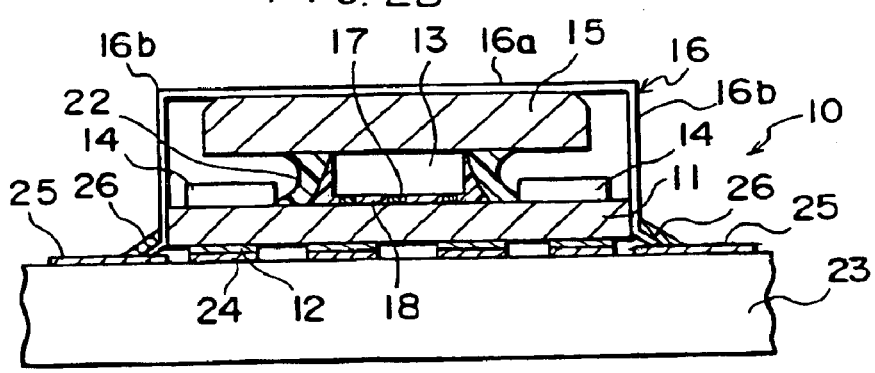
FIG. 2B is a sectional view showing the high frequency module mounted on a motherboard.
Figure 2C:
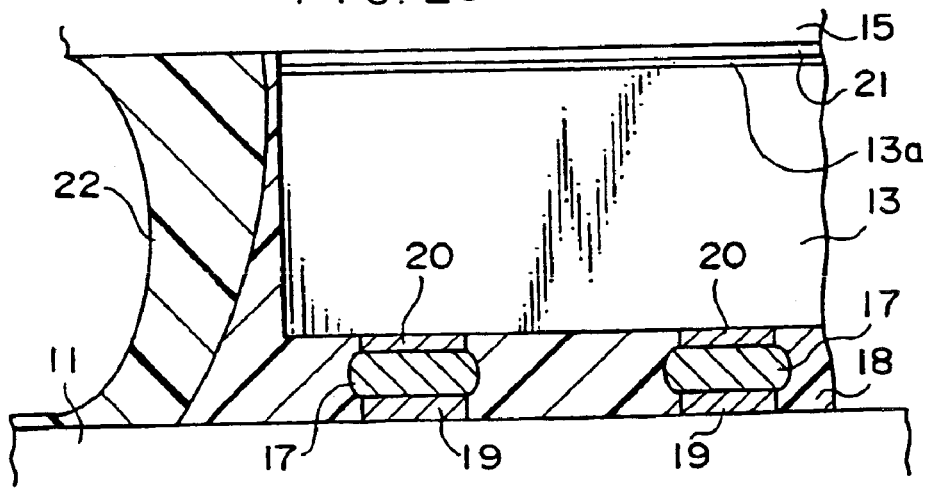
FIG. 2C is an enlarged sectional view of a part of FIG. 2B.
Figure 3:
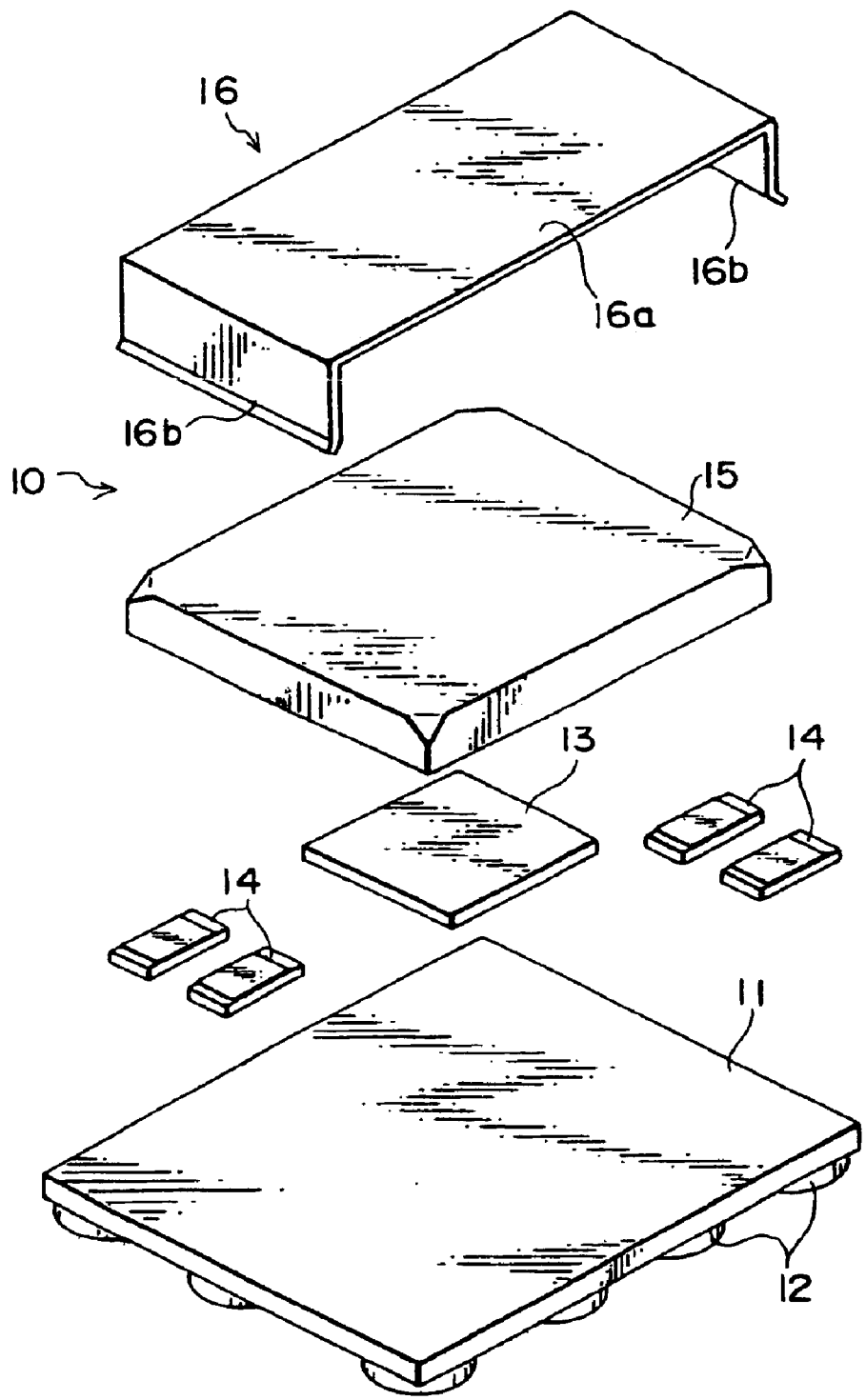
FIG. 3 is an exploded schematic perspective view showing the high frequency module of FIG. 2A.

FIG. 2A is a perspective view showing a high frequency module that is a preferred embodiment of the present invention. FIG. 2B is a sectional view showing the high frequency module mounted on a motherboard. FIG. 2C is an enlarged sectional view of a part of FIG. 2B. FIG. 3 is an exploded schematic perspective view showing the high frequency module of FIG. 2A.

As shown in FIGS. 2 and 3, the high frequency module 10 according to this preferred embodiment is constituted of a substrate 11, a plurality of electrodes 12 formed on the back surface of the substrate 11, a semiconductor chip 13 and electronic components 14, such as capacitors, each mounted on the main surface of the substrate 11, a roof plate 15 mounted on the upper surface of the semiconductor chip 13, and a cap 16. The high frequency module 10 having such a configuration is mounted on a motherboard 23 as shown in FIG. 2B.

The substrate 11 is a single layered insulating substrate or a multilayered substrate with elements are incorporated therein. Electrodes 19 are formed on the main surface of the substrate 11 to establish electrical connection with the semiconductor chip 13 and the electronic components 14, and the electrodes 19 are electrically connected to the electrodes 12 formed on the back surface of the substrate 11 via through holes (not shown).

The electrodes 12 are electrically connected to electrodes 24 formed on the motherboard 23 as shown in FIG. 2B.

The semiconductor chip 13 processes a high frequency signal and has a plurality of electrodes 20 provided thereon. Microbumps 17 made of solder or gold are formed on the electrodes 20. The microbumps 17 are electrically and mechanically connected to the electrodes 19 formed on the substrate 11 to establish electrical connection between the electrodes 19 formed on the substrate 11 and the electrodes 20 formed on the semiconductor chip 13 so that the semiconductor chip 13 is fixed on the main surface of the substrate 11 in a flip-chip manner. As shown in FIG. 2C, an underfilling resin 18 is charged and cured in a space formed between the semiconductor chip 13 and the substrate 11 so that the semiconductor chip 13 and the substrate 11 are strongly fixed to each other. It is preferable to use a low viscosity resin such as an epoxy type resin for the underfilling resin 18 because the underfilling resin 18 is required to be charged into the entire space between the semiconductor chip 13 and the substrate 11.

The roof plate 15 is a plate-shaped component made of aluminum, copper or the like. As shown in FIG. 2C, the roof plate 15 is electrically connected to an electrode 13a formed on the upper surface of the semiconductor chip 13 via solder or conductive adhesive 21. Further, an insulating resin 22 is provided between the roof plate 15 and the substrate 11 at the portion where the semiconductor chip 13 is mounted so that the semiconductor chip 13, the roof plate 15, and the substrate 11 are fixed to one another and the semiconductor chip 13 is passivated. It is preferable to use a high viscosity resin such as a silicon type resin for the resin 22 because the resin 22 is required to sufficiently passivate the semiconductor chip 13.

The cap 16 is formed by bending a tape-shaped metal component made of aluminum, copper or the like. The cap 16 has a flat portion 16a and extended portions 16b led out from the both edges. The flat portion 16a of the cap 16 is electrically connected and fixed to the roof plate 15 by solder, conductive adhesive, or spot welding (not shown). The extended portions 16b contact the both of side surfaces of the substrate 11 as though pinching it. Ground electrodes (not shown) are formed on both side surfaces of the substrate 11. The ground electrodes and the extended portions 16b are electrically connected and fixed to each other by conductive adhesive or solder (not shown).

As described above, a plurality of electrodes 24, which are connected to the electrodes 12 on the substrate 11, are formed on the motherboard 23 on which the high frequency module 10 is mounted. Further, ground electrodes 25 are formed on the motherboard 23. The ground electrodes 25 and lower portions of the extended portions 16b of the cap 16 are connected by solder 26.

According to the high frequency module 10 having the above described configuration, heat generated by the semiconductor chip 13 is conducted through the roof plate 15 and the cap 16 to the substrate 11 and the ground electrodes 25 of the motherboard 23. In this case, because the extended portions 16b of the cap 16 lie along the side surfaces of the substrate 11, the flat portion 16a of the cap 16 can contact the entire upper surface of the roof plate 15 and the extended portions 16b of the cap 16 can contact the side surfaces of the substrate 11 without leaving a gap. Thus, extremely good heat dissipation performance can be obtained.

Further, in the high frequency module 10, the roof plate 15 can work as a heat sink to accumulate heat because the roof plate 15 is inserted between the semiconductor chip 13, a heat source, and the cap 16. Heat accumulated in the roof plate 15 is conducted through the flat portion 16a of the cap 16 to the substrate 11 and the motherboard 23 via the extended portions 16b. Thus, the heat dissipation performance is markedly improved because the roof plate 15 works as a heat sink. Further, as shown in FIGS. 2 and 3, therefore the roof plate 15 is thicker than the cap 16. The roof plate 15 therefore has good heat sink capability, so that even if the semiconductor chip 13 processes a signal having relatively large electric power, as in the case of a high frequency power amplifier, and thus generates a large amount of heat, the heat can be sufficiently dissipated. Moreover, as shown in FIGS. 2 and 3, the contact area of the roof plate 15 with the cap 16 is greater than the contact area of the roof plate 15 with the electrode 13a formed on the upper surface of the semiconductor chip 13. Heat accumulated in the roof plate 15 can therefore be efficiently conducted to the substrate 11 and the motherboard 23. It is worth noting that the material of the roof plate 15 is not limited to metal but can be resin or ceramic covered with a conductor.

Although most of the heat generated by the semiconductor chip 13 is conducted to the motherboard 23 via the roof plate 15 and cap 16, part of heat is conducted to the substrate 11 via the microbumps 17 and the resin 18. Heat conducted to the substrate 11 is also conducted to the motherboard 23 via the electrodes 12.

Because the high frequency module 10 according to this embodiment can be used in a high frequency band over 1 GHz, for example, a predetermined potential must be applied to the electrode 13a formed on the upper surface of the semiconductor chip 13. The potential of the electrode 13a formed on the upper surface of the semiconductor chip 13 can be reliably made the same potential as the ground potential applied to the motherboard 23 because the electrode 13a formed on the upper surface of the semiconductor chip 13 is connected to the ground electrodes 25 on the motherboard 23 via the roof plate 15 and the cap 16.

Furthermore, because the cap 16 is thinner than the roof plate 15, it is easy to bend. If the cap 16 and the roof plate 15 should be constituted as a single component, the component would be difficult to form because of its complex shape. In the high frequency module 10, the cap 16, which is easy to bend because it is thin, and the roof plate 15, which has good heat accumulation performance because it is thick, are separate members. The high frequency module 10 can therefore be easily fabricated at low cost. Moreover, in the high frequency module 10, the fact that the roof plate 15 and the cap 16 are separate members enables use of the same cap 16 with various semiconductor chips 13 of different thickness and various substrates 11 of different thickness simply selecting a roof plate 15 of appropriate thickness. Thus, flexibility is enhanced and the cost can be decreased.

Furthermore, because the roof plate 15 can be thickened by thinning the cap 16 while staying within the allowable total thickness of the high frequency module 10, the heat sink performance of the roof plate 15 can be enhanced. It is preferable to use aluminum or copper as the material of the cap 16, as mentioned above. Taking cost, thermal conductivity, and electric conductivity into consideration, however, it is most preferable to use aluminum.

Use of aluminum as the material of the roof plate 15 is advantageous in the points of electric conductivity, thermal conductivity, and cost. In addition, use of aluminum enables the connection and heat conduction between the semiconductor chip 13 and the ground electrodes (not shown) formed on the substrate 11 to be sufficiently performed. This also lowers cost.

In the high frequency module 10 according to the embodiment, because the cap 16 does not entirely cover the semiconductor chip 13 and the electronic components 14, the semiconductor chip 13 and the electronic components 14 can be visually observed after the high frequency module 10 is mounted on the motherboard 23. This makes it easy to find and repair defects if any malfunctions are detected after the high frequency module 10 is mounted on the motherboard 23. However, it is not an essential feature of this invention that the cap 16 does not entirely cover the semiconductor chip 13 and the electronic components 14. Therefore, the extended portions 16b can if desired be led out from the all edges of the flat portion 16a to cover all sides of the substrate 11.

Another preferred embodiment of the present invention will be explained.

Figure 5:
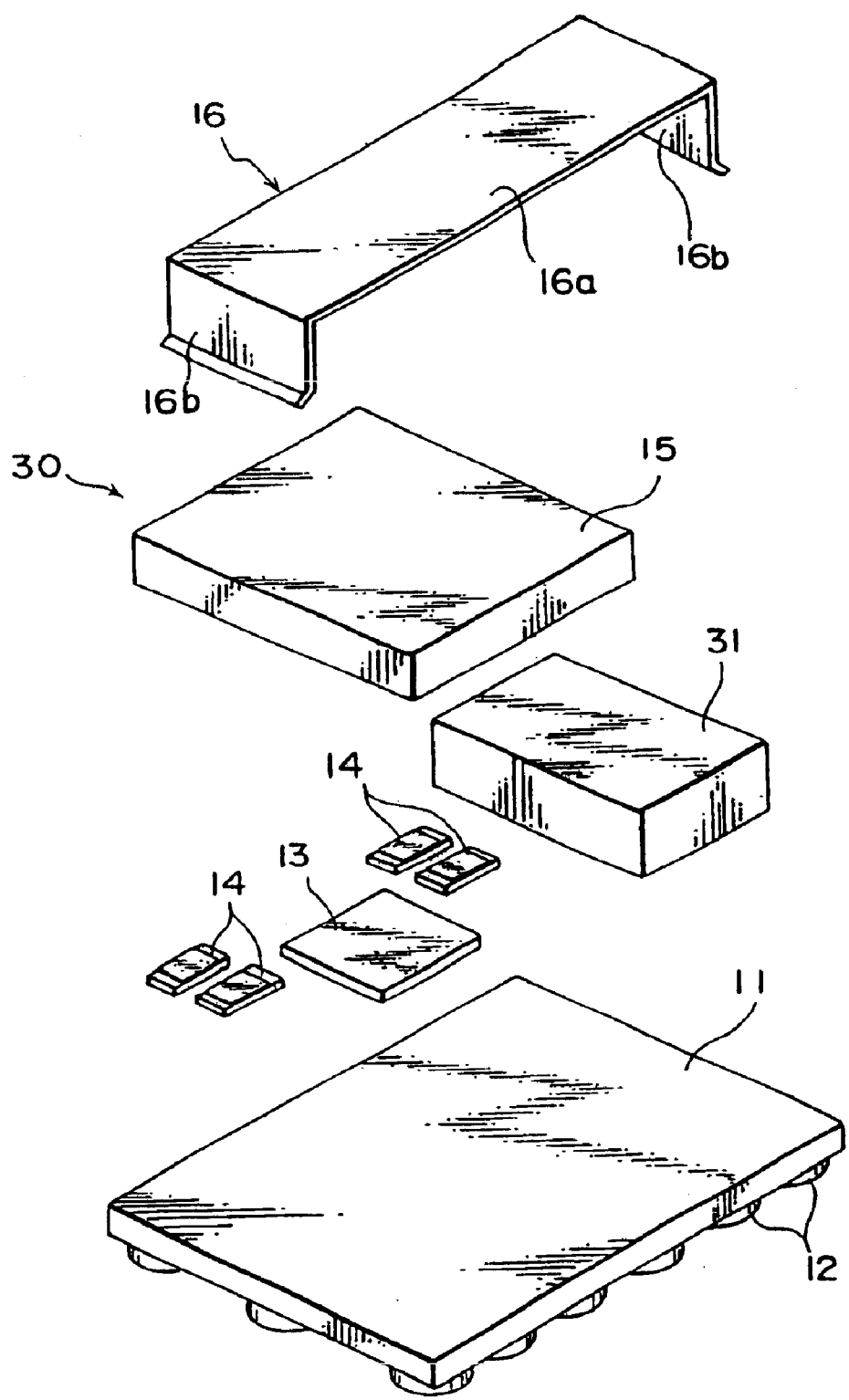
FIG. 5 is an exploded schematic perspective view showing a high frequency module that is another preferred embodiment of the present invention.

FIG. 4A is a perspective view showing a high frequency module that is another preferred embodiment of the present invention. FIG. 4B is a sectional view showing the high frequency module mounted on a motherboard. FIG. 5 is an exploded schematic perspective view showing the high frequency module of FIG. 4A.

The high frequency module 30 according to this preferred embodiment is constituted of a substrate 11, a plurality of electrodes 12 formed on the back surface of the substrate 11, a semiconductor chip 13 and electronic components 14, such as capacitors, each mounted on the main surface of the substrate 11, an isolator 31 that is taller than the semiconductor chip 13, a roof plate 15 mounted on the upper surface of the semiconductor chip 13, and a cap 16. The high frequency module 30 having such a configuration is mounted on a motherboard 23 as shown in FIG. 4B.

The isolator 31 of the type is widely used as a non reciprocal circuit element at the stage following a high frequency amplifier. The isolator 31 tends to be taller than other components because it includes a ferrite core made of a YIG or the like, a permanent magnet mounted on the ferrite core, and a metal plate made of iron or the like wrapped around them as a magnetic yoke.

In the high frequency module 30, the roof plate 15 is electrically connected to an electrode 13a (not shown in FIGS. 4 and 5) formed on the upper surface of the semiconductor chip 13 by solder or conductive adhesive 21 (not shown in FIGS. 4 and 5). The upper surface of the roof plate 15 is coplanar with or slightly higher than the upper surface of the isolator 31. The reason for setting the upper surface of the roof plate 15 coplanar with or slightly higher than the upper surface of the isolator 31 is to avoid forming a gap between the roof plate 15 and the cap 16, since otherwise the upper surface of the roof plate 15 might become lower than the upper surface of the isolator 31 owing to a fabrication error.

The cap 16 has a flat portion 16a and extended portions 16b. The flat portion 16a of the cap 16 is electrically connected and fixed to the roof plate 15 by solder, conductive adhesive, or spot welding (not shown), and retains the upper surface of the isolator 31. The extended portions 16b contact both side surfaces of the substrate 11 as though pinching it therebetween. Ground electrodes (not shown) are formed on both side surfaces of the substrate 11. The ground electrodes and the extended portions 16b are electrically connected and fixed to each other by conductive adhesive or solder (not shown).

The roof plate 15 can adhere to the flat portion 16a of the cap 16 because the upper surface of the roof plate 15 is set coplanar with or slightly higher than the upper surface of the isolator 31. The electrical connection and the fixing between the substrate 11 and the semiconductor chip 13, between the cap 16 and the substrate 11, and between the cap 16 and the motherboard 23 are the same as in the high frequency module 10 of the embodiment explained earlier and will not be explained again here.

The high frequency module 30 according to this embodiment has the following advantages in addition to the advantages obtained from the high frequency module 10. Specifically, because the single cap 16 covers the semiconductor chip 13 and the isolator 31 both mounted on the same substrate 11, a nozzle of a mounter (not shown) can chuck at the flat portion 16a of the roof plate 16 to handle the high frequency module 30 when the high frequency module 30 including the substrate 11, the semiconductor chip 13, the roof plate 16, and the isolator 31 is mounted on the motherboard 23. With the high frequency module 30, therefore, handling is simplified during the mounting process despite the integration of the semiconductor chip 13 and the isolator 31 that are of different heights.

A further preferred embodiment of the present invention will be explained.

Figure 7:
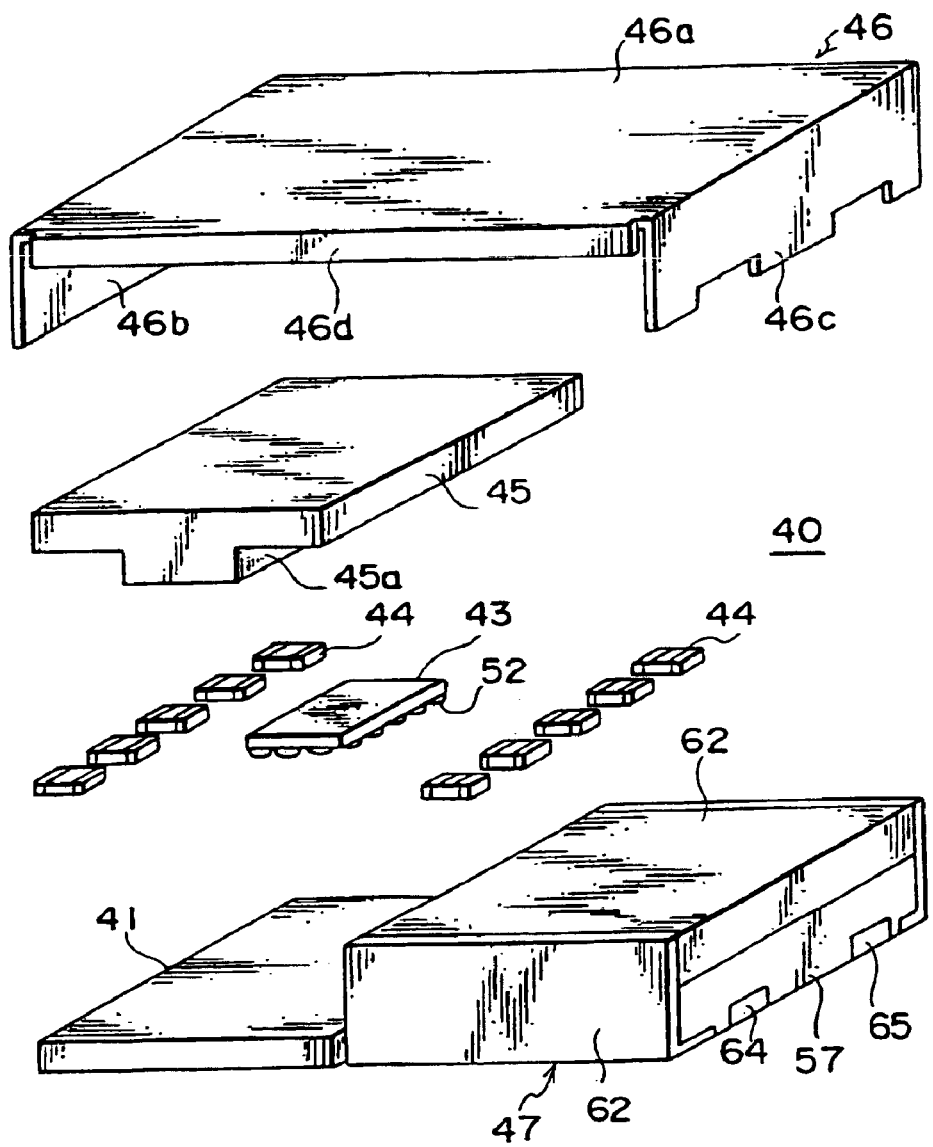
FIG. 7 is an exploded schematic perspective view showing the high frequency module of FIG. 6.
Figure 8:
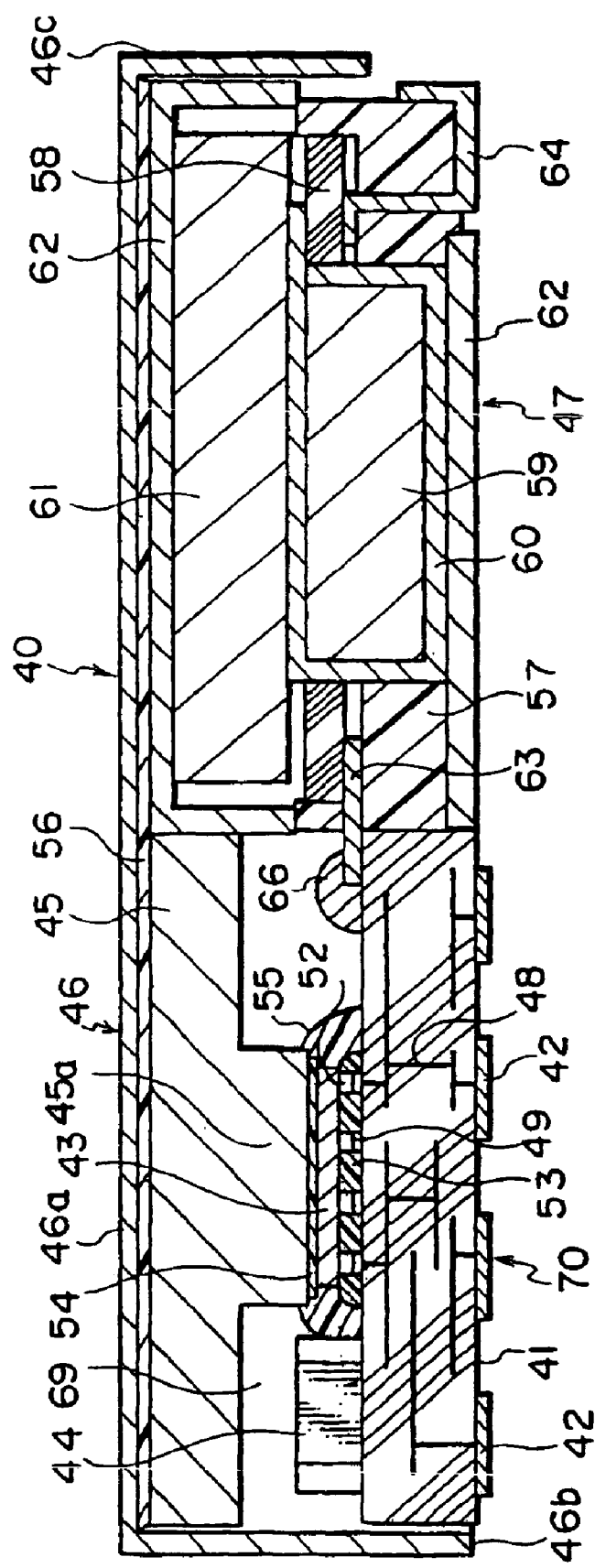
FIG. 8 is a sectional view showing a section along line X—X in FIG. 6A.
Figure 9:
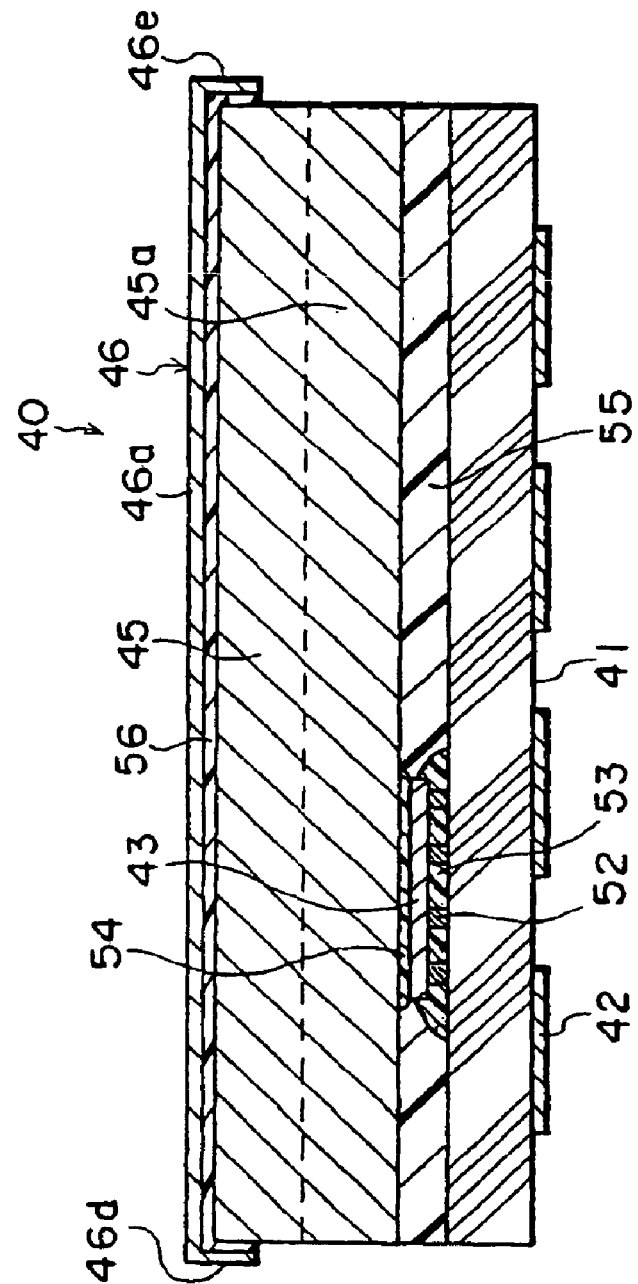
FIG. 9 is a sectional view showing a section along line Y—Y in FIG. 6A.

FIG. 6A is a perspective view showing a high frequency module that is further preferred embodiment of the present invention. FIG. 6B is a sectional view showing the high frequency module mounted on a motherboard. FIG. 7 is an exploded schematic perspective view showing the high frequency module of FIG. 6. FIG. 8 is a sectional view showing a section along line X—X in FIG. 6A. FIG. 9 is a sectional view showing a section along line Y—Y in FIG. 6A.

As shown in FIGS. 6 to 9, the high frequency module 40 according to this preferred embodiment is constituted of a substrate 41, a plurality of electrodes 42 formed on the back surface of the substrate 41, a semiconductor chip 43 and electronic components 44, such as capacitors, each mounted on the main surface of the substrate 41, a heat sink 45 mounted on the upper surface of the semiconductor chip 43, an isolator 47 as a non reciprocal circuit element, and a cap 46 covering the heat sink 45 and the isolator 47. The substrate 41, the semiconductor chip 43, the electronic components 44, and the heat sink 45 constitute a high frequency amplifier portion 70. The high frequency module 40 having such a configuration is mounted on a motherboard 23 as shown in FIG. 6B.

The substrate 41, which is part of the high frequency amplifier portion 70, is a multilayered substrate in which a number of conductive layers 48 are incorporated. Electrodes 49 are formed on the main surface of the substrate 41 to establish electrical connection with the semiconductor chip 43 and the electronic components 44, and the electrodes 49 are electrically connected to the electrodes 42 formed on the back surface of the substrate 41 via the conductive layers 48 incorporated in the substrate 41.

The electrodes 42 are electrically connected to electrodes 51 formed on the motherboard 23 via solder 50 as shown in FIG. 6B.

The semiconductor chip 43, which is part of the high frequency amplifier portion 70, is a chip composed of a Ga—As substrate, for example, for processing a high frequency signal. The semiconductor chip 43 employs a plurality of electrodes (not shown) on which microbumps 52 made of solder or gold are provided. The microbumps 52 are electrically and mechanically connected to the electrodes 49 formed on the main surface of the substrate 41 to establish electrical connection between the electrodes 49 formed on the substrate 41 and the electrodes (not shown) formed on the semiconductor chip 43 so that the semiconductor chip 43 is fixed on the main surface of the substrate 41 in a flip-chip manner. As shown in FIGS. 6 to 9, an underfilling resin 53 is charged and cured in a space formed between the semiconductor chip 43 and the substrate 41 so that the semiconductor chip 43 and the substrate 41 are strongly fixed to each other. It is preferable to use a low viscosity resin such as an epoxy type resin for the underfilling resin 53 because the underfilling resin 53 is required to be charged into the entire space between the semiconductor chip 43 and the substrate 41.

Each of the electronic components 44, which are part of the high frequency amplifier portion 70, is a discrete capacitor, for example. As shown in FIGS. 6 to 8, the upper surfaces of the electronic components 44 are higher than the upper surface of the semiconductor chip 43 when mounted on the substrate 41.

The heat sink 45, which is part of the high frequency amplifier portion 70, is made of aluminum metal. As shown in FIGS. 6 to 8, the heat sink 45 has a projecting portion 45a at the approximately center thereof. The projecting portion 45a has a constant width from one end to the other end of the heat sink 45. The heat sink 45 can therefore be easily and cheaply mass-produced by means of extruding of aluminum metal and cutting. The projecting portion 45a of the heat sink 45 is electrically connected to an electrode (not shown) formed on the upper surface of the semiconductor chip 43 by solder or a conductive adhesive 54. Further, an adhesive 55 is provided between the projecting portion 45a of the heat sink 45 and the substrate 41 so that the semiconductor chip 43, the heat sink 45, and the substrate 41 are fixed to one another and the semiconductor chip substantially throughout the region between the projecting portion 45a of the heat sink 45 and the substrate 41, so that the heat sink 45 and the substrate 41 are strongly fixed.

The upper surface of the heat sink 45 is coplanar with or slightly higher than the upper surface of the isolator 47. The reason for setting the upper surface of the heat sink 45 coplanar with or slightly higher than the upper surface of the isolator 47 is to avoid forming a gap between the heat sink 46 and the cap 46, since otherwise the upper surface of the heat sink 45 might become lower than the upper surface of the isolator 47 owing to a fabrication error. Because the heat sink 45 has the projecting portion 45a, a space 69 is formed between the heat sink 45 and the substrate 41. As shown in FIGS. 6 and 8, the electronic components 44 are provided in the space 69.

The cap 46 covers both the high frequency amplifier portion 70 and the isolator 47 and is formed by bending a tape-shaped metal component made of aluminum, copper or the like. The cap 46 has a flat portion 46a, extended portions 46b and 46c, and bent portions 46d and 46e. The flat portion 46a of the cap 46 is electrically connected and fixed to the upper surface of the heat sink 45 and the upper surface of the isolator 47 by solder, conductive adhesive, or spot welding 56. The extended portion 46b of the cap 46 covers one side surface of the heat sink 45 and one side surface of the substrate 41. The extended portion 46c of the cap 46 covers one side surface of the isolator 47. Thus, the extended portions 46b and 46c of the cap 46 contact one side surface of the substrate 41 and one side surface of the isolator 47 as though pinching them therebetween. Ground electrodes (not shown) are formed on the side surface of the substrate 41. The ground electrodes and the extended portion 46b are electrically connected and fixed to each other by conductive adhesive or solder (not shown).

As shown in FIG. 8, the isolator 47 is constituted of a support body 57, an insulating substrate 58, a ferrite core 59 made of a YIG or the like, a resonation conductor 60 covering the ferrite core 59, a permanent magnet 61, and a yoke 62 wrapping and integrating them. The insulating substrate 58 has an input terminal 63 for connection with the high frequency amplifier portion 70, a ground terminal (not shown), and electrodes 64 and 65 for connection with the electrodes 51 formed on the motherboard 23. The electrodes 64 and 65 formed on the isolator 47 and the electrodes 51 formed on the motherboard 23 are electrically connected to each other via solder 50.

The high frequency amplifier portion 70 and the isolator 47 having the above described configuration are adhered and integrated side by side to constitute the high frequency module 40. Electrical connections between the high frequency amplifier portion 70 and the isolator 47 are established by solder 66.

Prior to integration, each of the high frequency amplifier portion 70 and the isolator 47 is an intermediate product which can be inspected and trimmed independently. Therefore, after the high frequency amplifier portion 70 and the isolator 47 are fabricated, they can be inspected and trimmed before integration.

As described above, a plurality of electrodes 51 for connection with the electrodes 42 on the substrate 41 are formed on the motherboard 23 on which the high frequency module 40 is mounted. Further, ground electrodes 67 are formed on the motherboard 23. The ground electrodes 67 and lower portions of the extended portions 46b and 46c of the cap 46 are connected by solder 68.

Because the high frequency module 40 having the above described configuration employs the heat sink 45 having the projecting portion 45a, there is formed the space 69 for accommodating the electronic components 44, whose thickness is usually greater than that of the semiconductor chip 43 located between the projecting portion 45a of the heat sink 45 and the substrate 41. According to the high frequency module 40 of this preferred embodiment, therefore, even if the electronic components 44 are thicker than the semiconductor chip 43 that generates heat transferred to the heat sink 45, they can still be mounted on the same substrate 41.

Further, because the heat sink 45 has the projecting portion 45a, the heat capacity thereof is enhanced, so that the heat dissipation performance is enhanced. Moreover, because the adhesive 55 is provided between the projecting portion 45a and the semiconductor chip 43, the projecting portion 45a and the side surface of the semiconductor chip 43 can also be adhered to enhance the bonding strength therebetween is enhanced.

Furthermore, because the projecting portion 45a of the heat sink 45 is rail-shaped from one end to the other end of the heat sink 45, the heat sink 45 can be easily formed by extruding aluminum metal and cutting. The cost of fabricating the heat sink 45 is therefore low.

Further, in the high frequency module 40, the extended portions 46b and 46c of the cap 46 are soldered to the ground electrodes 67 on the motherboard 23. Heat generated by the semiconductor chip 43 is therefore conducted to the ground electrodes 67 on the motherboard 23 via the heat sink 45 and the cap 46. Because the heat sink 45 and the cap 46 constitute a heat storage having a large heat capacity and the neat accumulated therein is conducted to the ground electrodes 67, good heat dissipation performance can be obtained. Of the extendednportions 46b and 46c in the high frequency module 40, only the extended portion 46b touching the heat sink 45 and the substrate 41 is absolutely required to be soldered to the motherboard 23. However, taking the heat dissipation performance into consideration, it is preferable that both of the extended portions 46b and 46c be soldered to the motherboard 23.

Furthermore, in the high frequency module 40 of this preferred embodiment, the cap 46 and the yoke 62 of the isolator 47 are connected by the conductive adhesive or solder 56. Heat dissipation performance is therefore enhanced because heat generated by the semiconductor chip 43 is conducted to the yoke 62 via the heat sink 45 and the cap 46.

Further, in the high frequency module 40 of this preferred embodiment, the opposite ends of the cap 46 are formed with the narrow bent portions 46d and 46e (see FIG. 9) that meet the flat portion 46a at right angles. The mechanical strength of the cap 46 is therefore improved so that warping thereof can be avoided. Moreover, because the bent portions 46d and 46e have small width, visual observation of the high frequency amplifier portion 70 and the isolator 47 covered with the cap 46 is not obstructed to inspect visually the interfitting condition of the high frequency amplifier portion 70 and the isolator 47 with the cap 46 and, when necessary, to perform various operations, including, for example, using a dispenser to supply a solder paste or a conductive adhesive into the interfitting portion of the high frequency amplifier portion 70 and the isolator 47 with the cap 46. Moreover, because the high frequency amplifier portion 70 and the isolator 47 can be visually observed even after the high frequency module 40 is mounted on the motherboard 23, defects can be easily detected and repaired even after the high frequency module 40 has been mounted on the motherboard 23.

Furthermore, in the high frequency module 40 of this preferred embodiment, the isolator 47 is not mounted on the substrate 41 but is fixed to the side surface of the substrate 41. The total height of the high frequency module 40 is therefore not equal to the sum of the thicknesses of the isolator 47 and the substrate 41 but can be substantially set to only the thickness of the isolator 47. The total height can therefore be made small. As a result, the high frequency module 40 can be preferably utilized in a mobile phone or the like.

Further, in the high frequency module 40 of this preferred embodiment, because the cap 46 is in contact with the isolator 47, heat generated by the semiconductor chip 43 is also conducted to the isolator 47 via the cap 46, so that the heat dissipation performance is enhanced.

Figure 10:
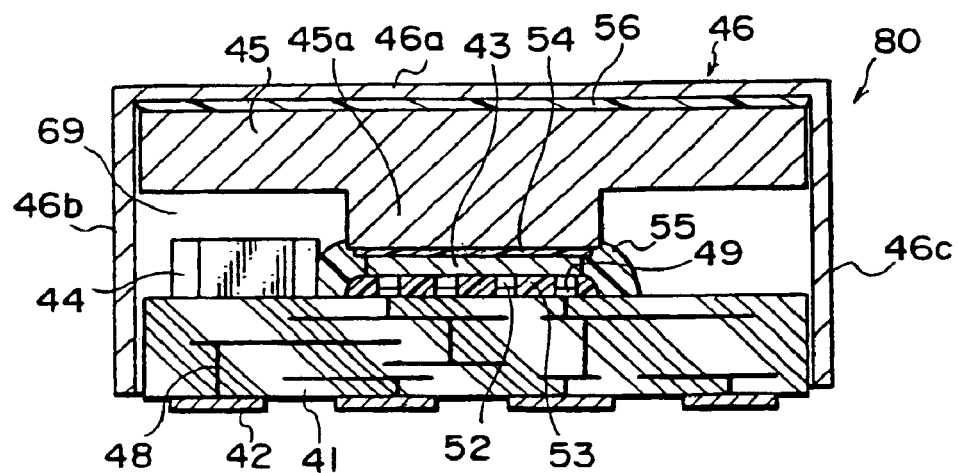
FIG. 10 is a sectional view showing the high frequency module shown in FIGS. 6 to 9 from which an isolator has been eliminated.

The high frequency module 40 according to the above described embodiment employs the high frequency amplifier portion 70 and the isolator 47 connected to each other and covered with the cap 46. However, as shown in FIG. 10, the high frequency module according to the present invention can be embodied as a high frequency module 80 obtained by eliminating the isolator 47 from the high frequency module 40.

Figure 11:
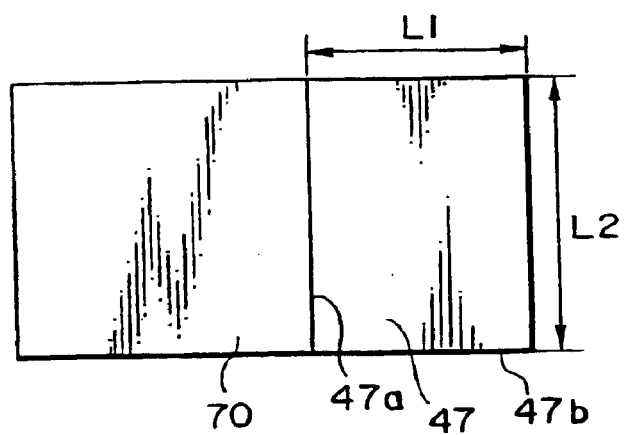
FIG. 11 is a schematic plan view showing a high frequency amplifier portion and an isolator.

The lateral length of the high frequency amplifier portion 70 and the lateral length of the isolator 47 are generally different from each other. However, in the high frequency module 40 according to the above described embodiment, because the plan shape of the isolator 47 is a rectangle measuring by L1×L2 in which L2 is coincident with the lateral length of the high frequency amplifier portion 70 as shown in FIG. 11, the high frequency module 40 can be formed in the overall shape of a rectangle. This not only makes handling of the high frequency module 40 easy but also makes it unnecessary for the cap 46 to have a complex structure. Cost can therefore be decreased. Further, because the lateral length of the isolator 47 is extended to be coincident with the lateral length L2 of the high frequency amplifier portion 70, the permanent magnet 61 can be enlarged in plan view to generate a stronger magnetic force without increasing the thickness thereof. Since this means that the thickness of the permanent magnet 61 can be minimized while still obtaining the required magnetic force, the total height of the high frequency module 40 can be reduced. Because the lateral length of the isolator 47 is coincident with the side length L2 of the high frequency amplifier portion 70, the overall shape of the high frequency module 40 can be made rectangular merely by connecting them. Thus, the isolator 47 need not be mounted on the substrate 41. This enables reduction of the total height of the high frequency module 40 and eliminates the need for various processing steps, such as forming via holes, that would be required if the isolator 47 were mounted on the substrate 41.

INDUSTRIAL APPLICABILITY

As described in the foregoing, the high frequency module according to the present invention can be preferably utilized in various communication apparatuses, particularly in mobile phones, owing to its superior heat dissipation performance, small size, and low cost.

What is claimed:

1. A high frequency module for mounting on a motherboard, comprising:
   a substrate;
   a semiconductor chip fixed on the substrate;
   a heat sink having a projecting portion in contact with the semiconductor chip; and
   a means, provided to cover the heat sink, for conducting heat transferred to the heat sink to the substrate;
   wherein the heat conducting means is a cap having a flat portion covering the heat sink and extended portions led out from opposite edges of the flat portion; and
   wherein the extended portions of the cap are connected to electrodes formed on the motherboard.

2. The high frequency module as claimed in claim 1, wherein said projecting portion of the heat sink is formed from one end to the other end of the heat sink.

3. The high frequency module as claimed in claim 2, wherein the heat sink is fabricated by extruding aluminum metal.

4. The high frequency module as claimed in claim 1, wherein the extended portion of the cap is in contact with a first side surface of the substrate.

5. The high frequency module as claimed in claim 4, wherein an upper surface of the non reciprocal circuit element is in contact with the flat portion of the cap.

6. The high frequency module as claimed in claim 5, wherein a first side surface of the non reciprocal circuit element is in contact with a second side surface of the substrate opposite to the first side surface of the substrate opposite to the first side surface thereof.

7. The high frequency module as claimed in claim 6, wherein the second side surface of the substrate and the first side surface of the non reciprocal circuit element have substantially the same length.

8. The high frequency module as claimed in claim 6, wherein a second side surface of the non reciprocal circuit element opposite to the first side surface thereof is in contact with the extended portion of the cap.

9. The high frequency module as claimed in claim 1, wherein the cap has bent portions led out from other opposite edges of the flat portion.

10. The high frequency module as claimed in claim 9, wherein the bent portion are led out from the flat portion by a shorter distance than the extended portions are led out therefrom.

11. The high frequency module as claimed in claim 10, wherein the bent portions extend to points short of side surfaces of the substrate to leave openings between the ends thereof and the substrate.

12. A high frequency module for mounting on a motherboard, comprising:
   a substrate;
   a semiconductor chip fixed on the substrate;
   a heat sink having a projecting portion in contact with the semiconductor chip;
   a means, provided to cover the heat sink, for conducting heat transferred to the heat sink to the substrate; and
   an electronic component provided in a space formed between the heat sink and the substrate.

13. The high frequency module as claimed in claim 12, wherein the electronic component is thicker than the semiconductor chip.

* * * * *

UNITED STATES PATENT AND TRADEMARK OFFICE
CERTIFICATE OF CORRECTION

PATENT NO.    : 6,906,259 B2                                          Page 1 of 1
DATED         : June 14, 2005
INVENTOR(S)   : Hayashi It is certified that error appears in the above-identified patent and that said Letters Patent is hereby corrected as shown below:

Column 3,
Line 44, delete "components-on" and insert -- components on --.

Column 12,
Line 42, after "chip" insert -- 43 is passivated. As shown in Fig.9, the adhesive 55 is provided --.

Column 14,
Line 8, delete "extendednportions" and insert -- extended portions --.

Column 16,
Line 30, delete "bent portion" and insert -- bent portions --.

Signed and Sealed this

Thirteenth Day of September, 2005

JON W. DUDAS
*Director of the United States Patent and Trademark Office*